United States Patent
Epler et al.

(10) Patent No.: US 7,601,989 B2
(45) Date of Patent: Oct. 13, 2009

(54) LED WITH POROUS DIFFUSING REFLECTOR

(75) Inventors: John E. Epler, Milpitas, CA (US); Hanmin Zhao, Fremont, CA (US); Michael R. Krames, Los Altos, CA (US)

(73) Assignee: Philips Lumileds Lighting Company, LLC, San Jose, CA (US)

(*) Notice: Subject to any disclaimer, the term of this patent is extended or adjusted under 35 U.S.C. 154(b) by 206 days.

(21) Appl. No.: 11/692,132

(22) Filed: Mar. 27, 2007

(65) Prior Publication Data

US 2008/0237619 A1    Oct. 2, 2008

(51) Int. Cl.
*H01L 33/00* (2006.01)
(52) U.S. Cl. .................... 257/98; 257/E33.068
(58) Field of Classification Search ............ 257/98, 257/E33.068
See application file for complete search history.

(56) References Cited

U.S. PATENT DOCUMENTS

2005/0161696 A1   7/2005   Yuri
2006/0255358 A1   11/2006  Shum
2007/0284600 A1 * 12/2007  Shchekin et al. ............ 257/98
2007/0284607 A1   12/2007  Epler et al.

OTHER PUBLICATIONS

International Search Report, 17 pages.

* cited by examiner

*Primary Examiner*—Trung Dang
(74) *Attorney, Agent, or Firm*—Patent Law Group; Brian Ogonowsky

(57) ABSTRACT

In one embodiment, an AlInGaP LED includes a bottom n-type layer, an active layer, a top p-type layer, and a thick n-type GaP layer over the top p-type layer. The thick n-type GaP layer is then subjected to an electrochemical etch process that causes the n-type GaP layer to become porous and light-diffusing. Electrical contact is made to the p-GaP layer under the porous n-GaP layer by providing metal-filled vias through the porous layer, or electrical contact is made through non-porous regions of the GaP layer between porous regions. The LED chip may be mounted on a submount with the porous n-GaP layer facing the submount surface. The pores and metal layer reflect and diffuse the light, which greatly increases the light output of the LED. Other embodiments of the LED structure are described.

26 Claims, 10 Drawing Sheets

LED WITH POROUS DIFFUSING REFLECTOR

FIELD OF THE INVENTION

This invention relates to light emitting diodes (LEDs) and, in particular, to a technique for improving the light extraction efficiency of an LED without increasing the operating voltage by providing a light-diffusing layer that adds virtually no forward voltage drop.

BACKGROUND

The materials used to form an LED largely determine the emission wavelength. One group III-V composition for a light generating active layer is AlInGaP. Such LEDs typically generate light in the red to yellow range. The active layer is sandwiched between a p-type cladding layer and an n-type cladding layer, resulting in a heterostructure. The LED layers typically contain aluminum indium gallium phosphide (AlInGaP) with varying percentages of Al and In, depending on various well known factors such as lattice matching with a GaAs growth substrate and the desired bandgap. GaAs absorbs visible light, and it is common for the GaAs substrate to be removed at the end of the growth process and replaced with a transparent GaP (0% Al and In) substrate.

GaP-based materials have a relatively high index of refraction (approximately 3.5). As such, in accordance with Snell's law, a light ray is internally reflected within the LED unless the light ray impinges on a wall of the LED within about 17 degrees of normal (the critical angle). Light reflects off the internal walls of the LED until it is emitted or absorbed. Since the LED chip is substantially rectilinear, the reflected light will repeat its angle of incidence even after multiple reflections. For each internal reflection, the light becomes attenuated. Therefore, it is desirable to extract light emitted by the active layer with a minimum of internal reflections. The efficiency of a GaP based LED, after encapsulation, is about 14%, meaning that for every seven electrons that enter the LED only one photon is emitted from the LED.

What is needed is a technique for increasing the light extraction efficiency of GaP based LEDs while not adversely affecting the forward voltage.

SUMMARY

In one embodiment, a conventional AlInGaP LED is formed over a GaAs growth substrate, where the LED layers comprise a bottom n-type AlInGaP cladding layer, an active layer, an upper p-type AlInGaP cladding layer, and a top p-type GaP layer. To increase the light extraction from the LED, a thick n-type GaP layer is grown over the top p-type layer. The thick n-type GaP layer is then subjected to an electrochemical etch process that causes the n-type GaP layer to become porous, reflective, and light-diffusing. The electrochemical etch only substantially affects n-type material.

The porous layer has an increased electrical resistance compared to a nonporous layer, which would result in an increased forward voltage of the LED if the porous layer were used in the current path. To prevent any forward voltage drop due to the porous layer, vias are etched in the porous layer to expose the non-porous p-layer, and metal is deposited in the vias and over the porous layer for making direct electrical contact to the underlying p-type layer.

In one embodiment, the light-absorbing GaAs growth substrate is removed after all layers are grown and then replaced with a wafer-bonded GaP substrate.

An electrical contact for the "bottom" n-type AlInGaP layer may be formed on the wafer-bonded GaP substrate (n contact and p contact are on opposite surfaces), or the LED chip may be a flip chip where both p and n metal contacts are formed on the same surface.

When light is generated by the active layer, the light that impinges on the porous layer is reflected and scattered, increasing the chances that the reflected light will exit out of the LED. In contrast, in a typical prior art LED, the angle of incidence equals the angle of reflection, resulting in a reflected light ray never being within the critical angle for escaping the LED. The electrical contacting schemes described herein enable the use of the porous layer without substantially increasing the forward voltage of the LED. Although there is always some resistance in metal, any increase in forward voltage is trivial and approximately zero.

In another embodiment, the top n-GaP layer (overlying the p-type GaP layer and prior to being made porous) is masked to expose portions of the top surface of the n-GaP layer. The exposed n-GaP regions are then subjected to the electrochemical etch to make those n-GaP regions porous and light diffusing. A dielectric/metal layer stack may then be deposited and patterned to only cover the porous regions, where the dielectric/metal layers serve as a reflector for light passing through the porous regions. The resist is then removed and the top surface is subjected to p-type doping (e.g., Zn), where the p-type dopants diffuse into the exposed non-porous n-GaP portions to convert those portions to p-type. A metal layer is then formed over the top surface of the p-type portions and the dielectric/metal layers. Since direct contact is made between the metal and the non-porous p-type portions, no current flows through the porous portions so there is no increased forward voltage drop. Accordingly, no vias are required in this embodiment to contact the non-porous p-layer.

In another embodiment, the GaAs growth substrate is removed after forming the bottom n-type AlInGaP layer, the active layer, the upper p-type AlInGaP layer and the top p-type GaP layer. The growth substrate is then replaced with an n-type GaP substrate directly contacting the n-type AlInGaP layer. The GaP substrate is then subjected to the electrochemical etch process to form the porous layer. Metal-filled vias are then formed through the porous layer to directly contact the n-type AlInGaP layer so that there will be no forward voltage drop across the porous layer. A metal layer over the porous layer contacts the vias to form the cathode electrode.

In another embodiment, p-type AlInGaP cladding layers are grown over the GaAs substrate followed by growing the active layer, an n-type AlInGaP cladding layer, and a top n-type GaP layer. The n-type GaP layer is then made porous using the electrochemical etch. Metal-filled vias are then formed through the porous layer so that no current flows through the high-resistance porous layer. The GaAs substrate is removed to allow light to exit through the top of the p-layer. An electrical contact is made to the p-layer.

An anti-reflection coating on the light extraction surface may be combined with the porous layer to achieve a better extraction. Without the internal scattering provided by the porous layer, an anti-reflection coating is not a cost effective means to improve the performance of a rectangular chip.

All embodiments may be flip chips or have the anode and cathode electrodes on opposite surfaces of the LED.

The chip may be rectangular or shaped to further increase light extraction.

BRIEF DESCRIPTION OF THE DRAWINGS

The same or similar elements in the figures are labeled with the same numerals.

DETAILED DESCRIPTION

Although the invention can augment any type of GaP based LED, only a few examples of LEDs will be described. The LED layers may be grown using conventional techniques, and their exact compositions and thicknesses are not relevant to the invention. Various details of the electrochemical etch process and the porous layer used in the examples are described in U.S. patent application Ser. No. 11/423,413, filed on Jun. 9, 2006, entitled Semiconductor Light Emitting Device Including Scattering Layer, by John Epler et al., assigned to the present assignee and incorporated in its entirety by reference.

Figure 1:
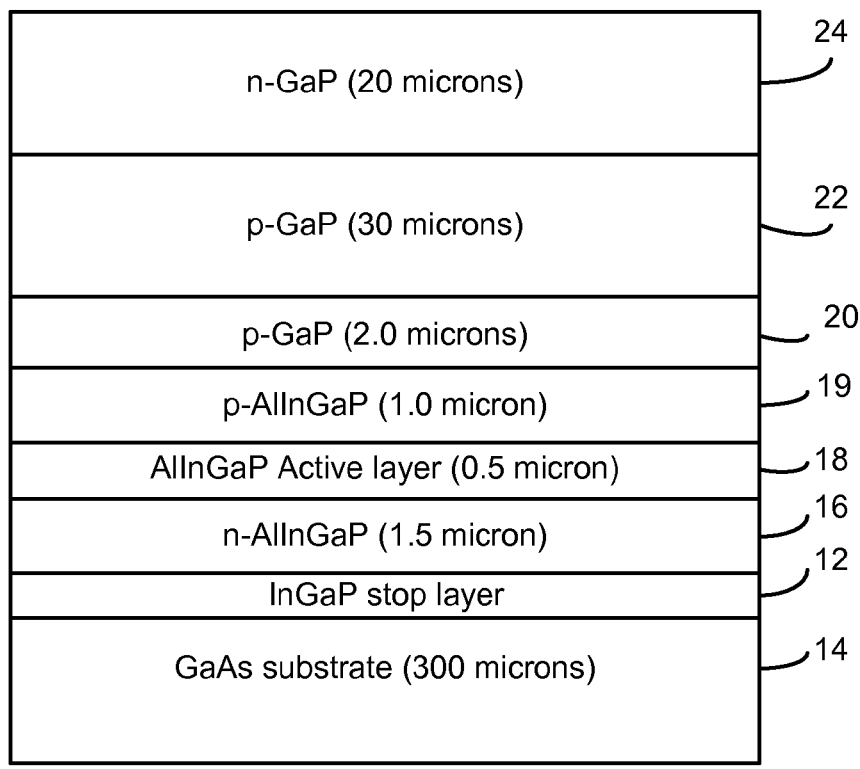
FIG. 1 illustrates in cross-section the various AlInGaP semiconductor layers grown over a GaAs growth substrate in one embodiment of the invention.

In FIG. 1, a thin InGaP stop layer 12 is grown over a 300 micron thick GaAs substrate 14. The stop layer 12 is later utilized when etching away the light-absorbing GaAs substrate.

A 1.5 micron thick n-type AlInGaP layer 16 is grown over the stop layer 12, followed by growing a 0.5 micron thick AlInGaP active layer 18. The composition of the active layer affects the wavelength of light emitted by the LED. The active layer 18 may comprise multiple layers, as is well known. A 1.0 micron thick p-type AlInGaP layer 19 is then grown over the active layer 18. A 2.0 micron thick p-type GaP layer 20 is grown over layer 19. The above layers are all grown using metalorganic chemical vapor deposition (MOCVD). The layers 16 and 19 are called confining layers or cladding layers. Each layer may comprise multiple layers for the purpose of reducing stress, varying the bandgap, current spreading, or other known purpose.

Next, a 30 micron thick p-type GaP layer 22 is grown by vapor-phase epitaxy (VPE), followed by a 20 micron thick n-type GaP layer 24 also formed by VPE. The layers 22 and 24 are also referred to below as a p-GaP layer 22 and an n-GaP layer 24 for brevity. One benefit of the thick p-GaN layer 22 is for current spreading. In another embodiment, the layer directly underlying the n-GaP layer 24 is the p-type cladding layer 20. The n-GaP layer 24 is preferably greater than 5 microns thick for adequate light diffusion after it is made porous.

Figure 2:
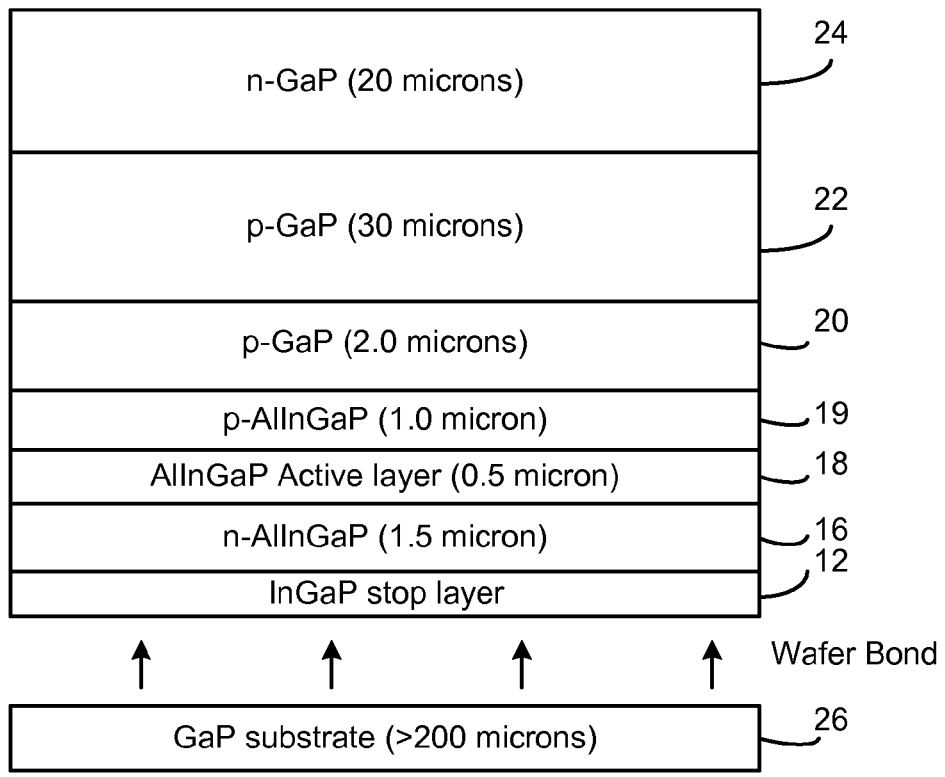
FIG. 2 illustrates the removal of the light-absorbing GaAs substrate and the wafer bonding of a transparent GaP substrate.

In FIG. 2, the GaAs substrate 14 is etched away using a chemical etch, where the InGaP layer 12 acts as a stop layer. A transparent GaP substrate 26, such as greater than 200 microns thick, is then wafer-bonded to the InGaP stop layer 12. The removal of the GaAs substrate 14 and the wafer bonding of the GaP substrate 26 are conventional when forming GaP based LEDs. The GaAs substrate 14 may be removed using a variety of other methods including polishing or ion etching/milling. The bonding of the GaP substrate 26 may be accomplished using heat and pressure. The crystal orientation of the GaP substrate 26 should be aligned with the crystal orientation of the InGaP layer 12 to maximize the electrical conductivity of the junction. The removal of the GaAs substrate and the wafer bonding step may be performed at any other time in the LED fabrication process. Substrates other than a GaP material may also be used. Substrate removal and wafer bonding, as well as forming an AlInGaP LED, are discussed in U.S. Pat. No. 5,376,580 by Fred Kish et al., incorporated herein by reference.

In subsequent figures, the p-GaP layers 20 and 22 are merged into a single layer 22 for simplicity.

Figure 3:
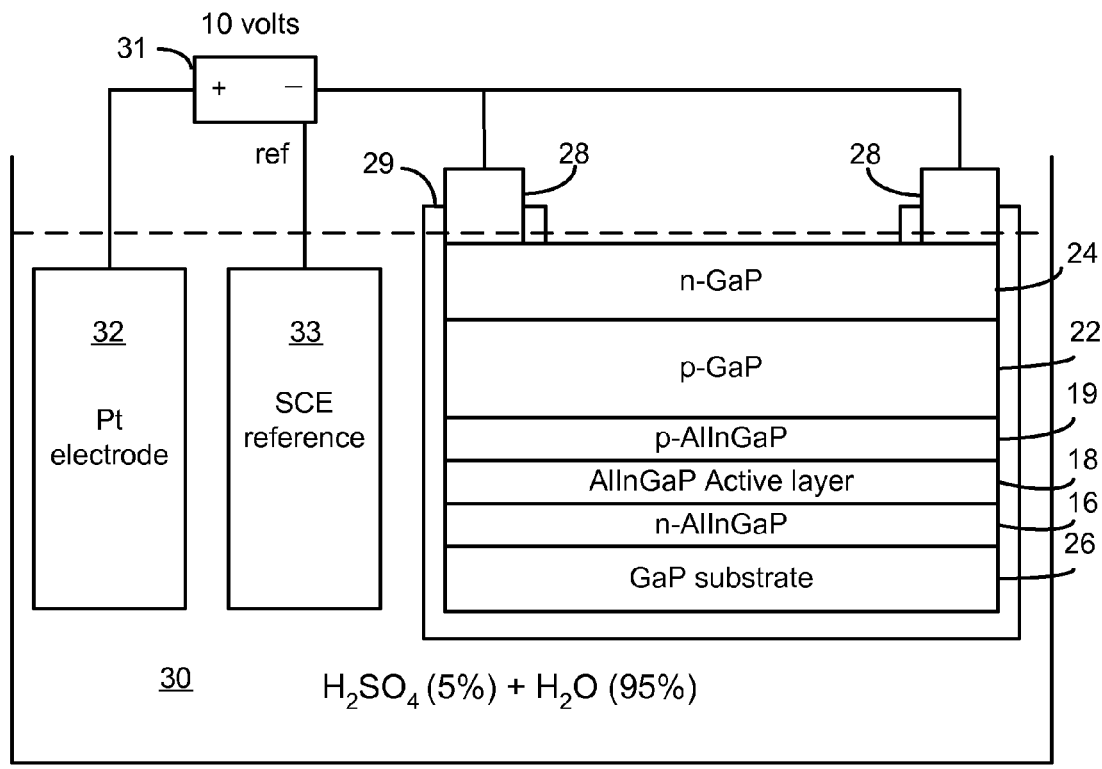
FIG. 3 illustrates an electrochemical process to make the top n-GaP layer porous so as to be light diffusing.

In FIG. 3, the n-GaP layer 24, having a preferred dopant density of $1.0E17$ to $1.0E19/cm^3$, is made porous by an electrochemical etch process using an electrolyte. Temporary electrical contacts 28 are formed on the surface of the n-GaP layer 24 by a conventional metal deposition process. Electrical contact to the GaP layer 24 may be achieved in other ways. A temporary Teflon protective layer 29 is provided over the LED to only expose the top portion of the GaP layer 24 to the electrolyte. The Teflon layer 29 may be part of a reusable support structure for the wafer. At least the n-GaP layer 24 is immersed in an acid bath 30 of 5% sulfuric acid as the electrolyte. A platinum electrode 32 (a counter electrode) and a Saturated Calomel Electrode (SCE) 33 (a reference electrode) are also immersed in the bath. A DC voltage source 31 applies about 10-15 volts between the GaP layer 24 and platinum electrode 32, referenced to the SCE 33. The current is approximately 50 mA/sq. inch. Over time, the electrochemical reaction caused by the current flow between the n-GaP layer 24 and the platinum electrode 32 etches vertical pores (like hollow tubes) through the entire thickness of the n-GaP layer 24. Each pore begins etching at a submicron pit at surface defects in the GaP layer 24. The etched GaP material flows into the bath solution. These pores have a diameter of about 150 nm, are approximately equally spaced (e.g., 0.5-1.0 microns apart), and comprise about 15%-75% of the volume of the porous n-GaP layer 24. In another embodiment, the pores comprise any amount over 10% of the volume of the GaP layer 24 and still provide substantial light diffusion. The process substantially self-terminates after the pores reach the p-GaP layer 22. The remainder of the LED chip is immune to the electrochemical process. The current density, dopant density, thickness, conductivity type, etchant solution, and bias voltage influence the pore density and size.

In an optional step to increase the pore size, the electrochemically etched wafer is exposed to an $H_2O:H_2SO_4:H_2O_2$ electrolyte using 50 mW/cm$^2$ of sub-bandgap light from a Xe lamp, under an applied positive potential of 2 volts referenced to the SCE. The applied potential is too low for the above-described etching process to take place and the sub-bandgap light is only absorbed at the electrolyte-semiconductor interface, so the primary effect is to increase the porosity of the layer defined in the first step. The degree of porosity is determined by the time-integrated current density, which is a function of light intensity, etchant concentration, and substrate parameters.

Figure 4:
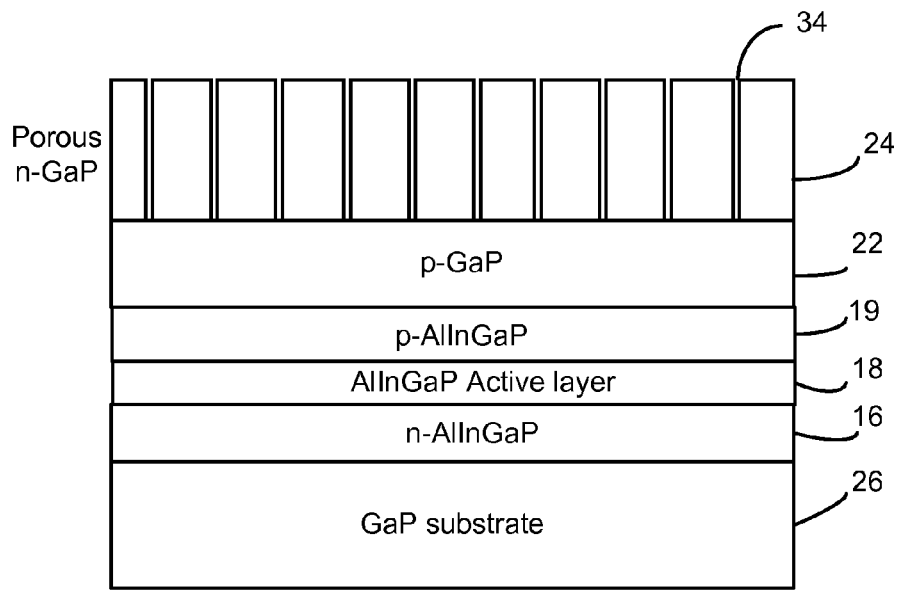
FIG. 4 illustrates the resulting LED chip after the process of FIG. 3.

FIG. 4 is a cross-sectional view of the resulting LED chip showing the vertical pores 34 extending through the n-GaP layer 24.

Figure 5:
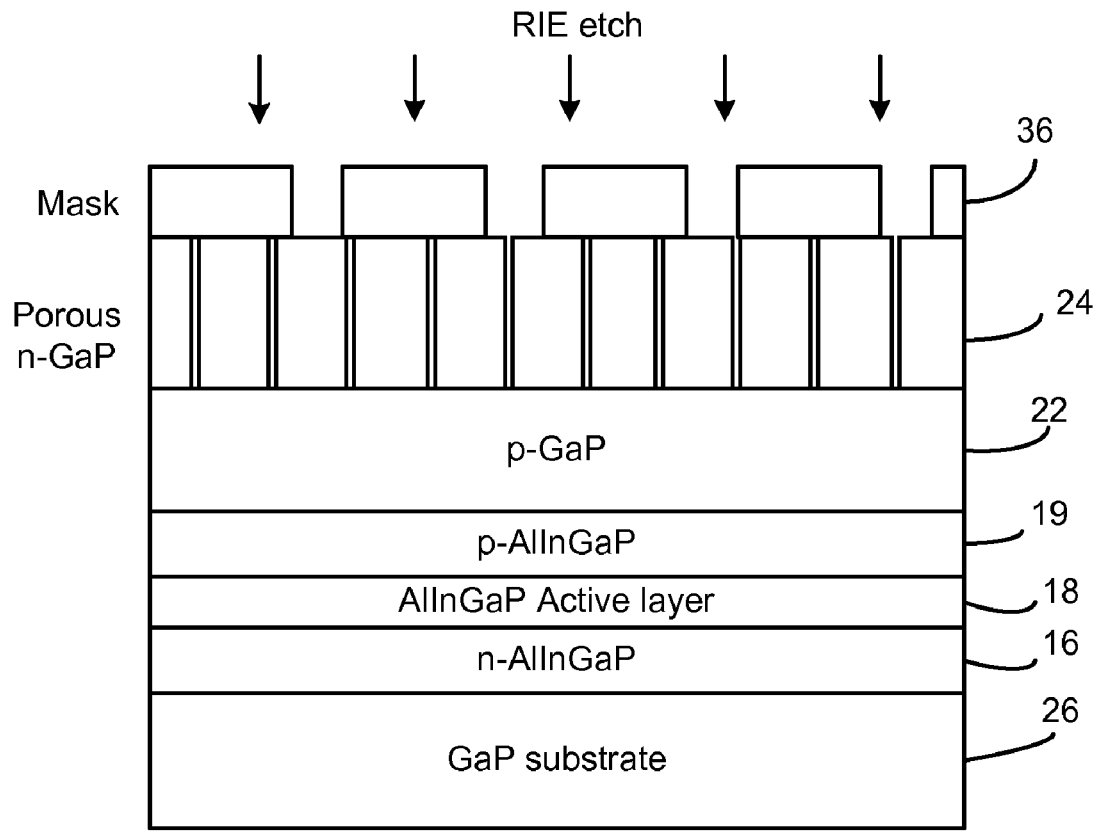
FIGS. 5 and 6 illustrate a selective etch of the porous n-GaP layer to form vias extending to the underlying p-layer.

In FIG. 5, the porous n-GaP layer 24 is selectively masked with a photoresist 36 using standard photolithographic techniques, where openings in the mask define where conductive vias are to be formed for providing electrical contact to the underlying p-GaP layer 22. A reactive ion etch (RIE) is performed to etch the vias completely through the porous n-GaP layer 24. Photochemical etching methods may also be used to etch the vias. In one embodiment, the vias are spaced 30 microns apart and the diameter of each via is 5 microns.

Figure 6:
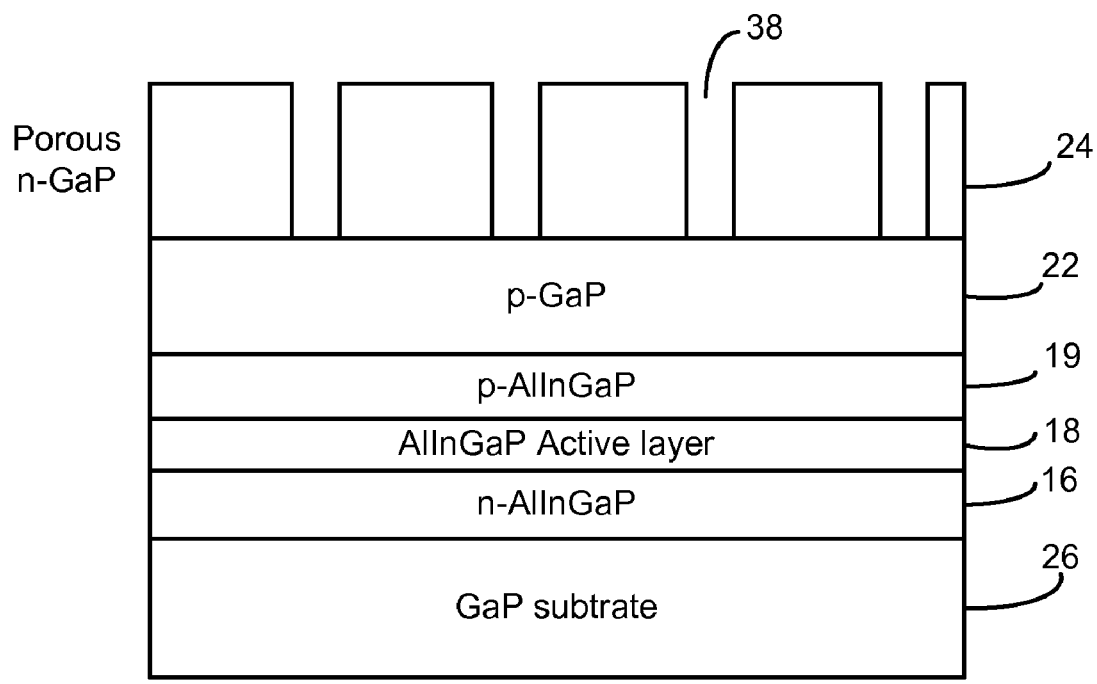
Figure 7:
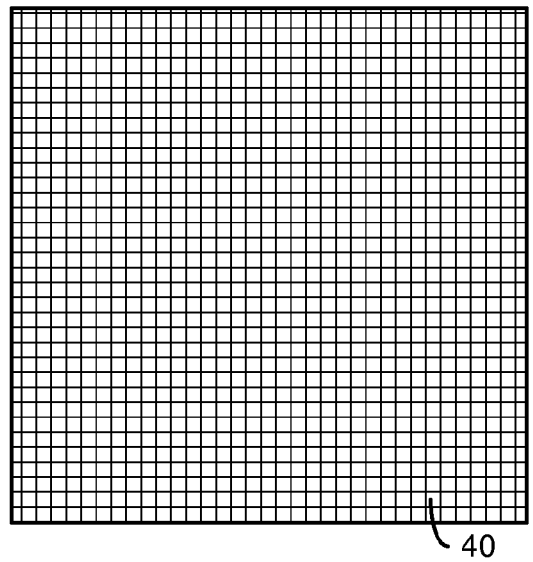
FIG. 7 is a top down view of the LED chip showing a grid arrangement of the metal-filled vias through the porous n-GaP layer.
Figure 8:
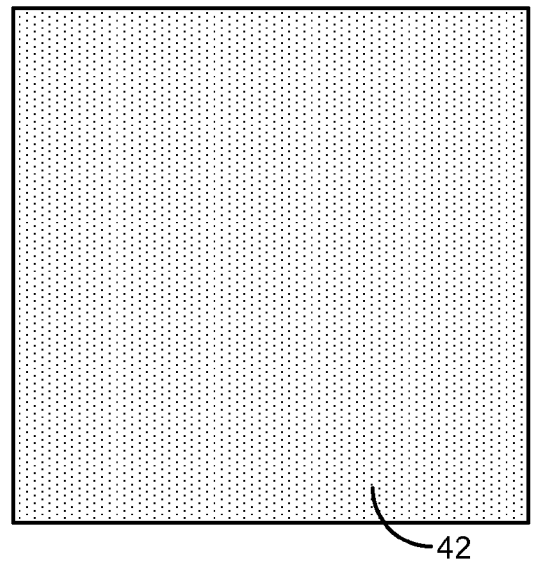
FIG. 8 is a top down view of the LED chip showing a dot arrangement of the metal-filled vias through the porous n-GaP layer.

FIG. 6 illustrates the vias 38 formed by the process of FIG. 5. The vias may be in any pattern, such as a grid 40 shown by the top down view of FIG. 7 (black lines are trenches in the n-GaP layer 24) or an array of dots 42 shown in FIG. 8.

Figure 9:
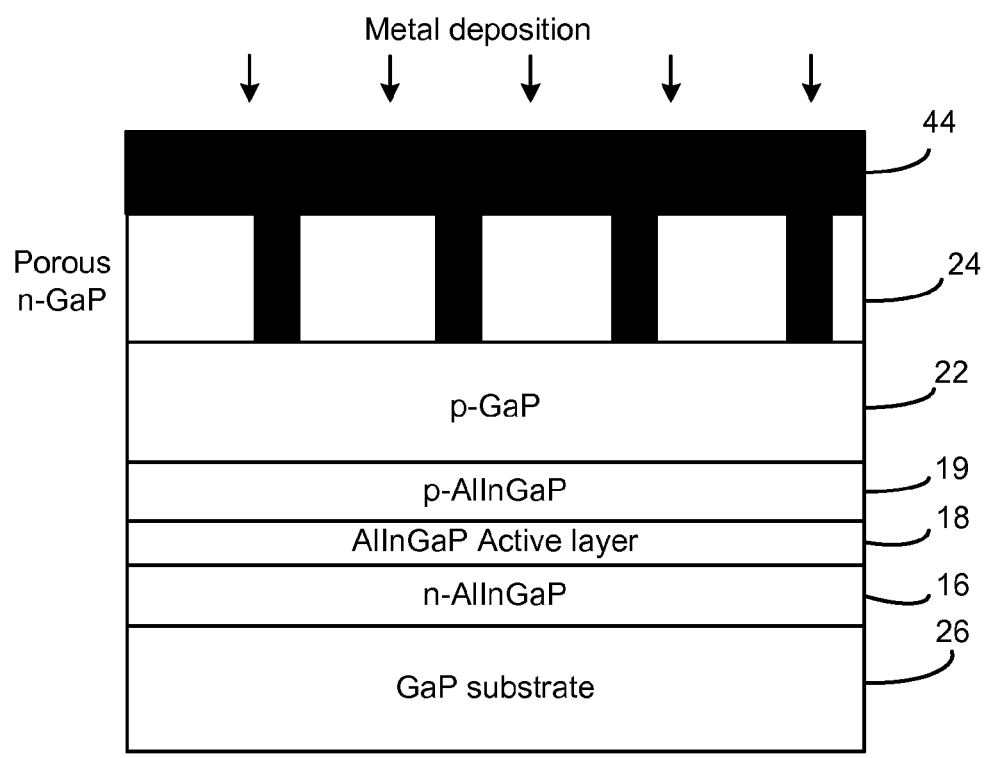
FIG. 9 illustrates depositing metal in the vias to electrically contact the p-layer.

In FIG. 9, metal (e.g., AuZn) is deposited over the surface of the porous n-GaP layer 24 using any suitable conventional technique (e.g., sputtering) to fill the vias 38 and form a metal layer 44 over the n-GaP layer 24. The AuZn layer is capped, using sputtering, with a barrier layer of TiW, followed by a layer of Au as a bonding metal for solder or an ultrasonic weld. Any shallow dimples in the metal layer 44 due to the vias are not shown for simplicity.

Figure 10:
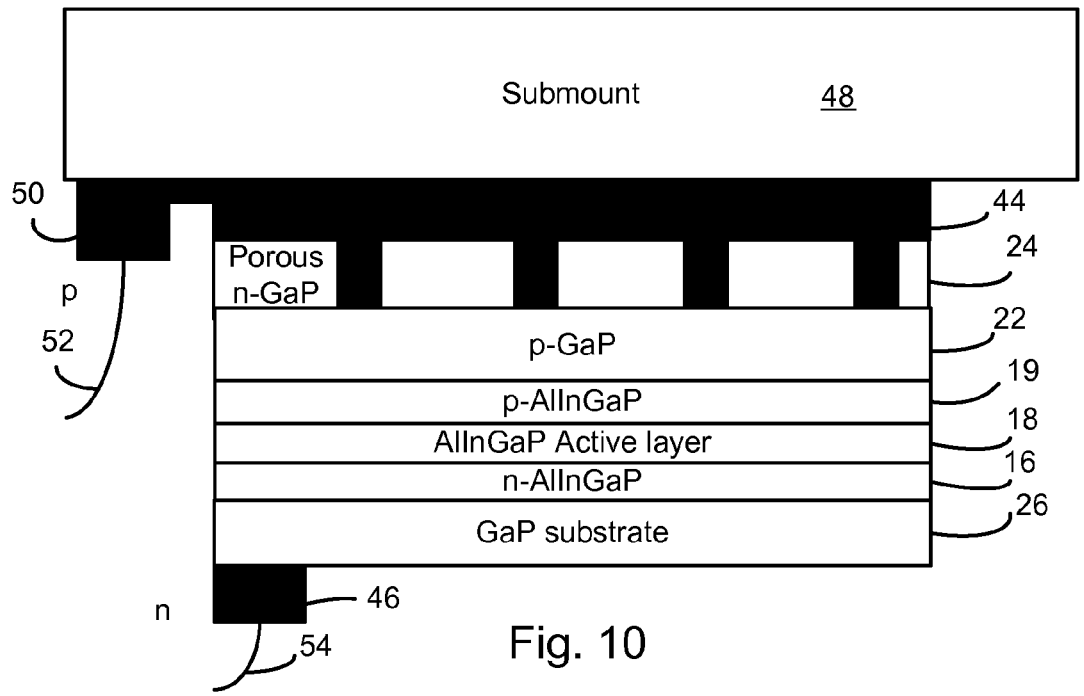
FIG. 10 illustrates the resulting chip after forming an n-metal contact and after the LED dies are separated from the wafer and mounted on a submount.

As shown in FIG. 10, a metal contact 46 is then formed on the conductive GaP substrate 26 to make electrical contact to the n-AlInGaP layer 16. The contact 46 may be AuGe with an Au cap formed using evaporation.

The wafer containing the LEDs is then scribed and broken, or sawed, to singulate the LED dies. Each LED die is then mounted onto a submount 48. In one embodiment, a gold pad on the submount 48 is ultrasonically welded to the metal layer 44 on the LED die. The body of the submount 48 is an electrical insulator, such as a ceramic. A metal pattern on the submount 48 extends from under the die and terminates in a p-bonding pad 50 for connection to a wire 52. A wire 54 is also bonded to an n-contact 46. The n-electrode metal may be in other forms to allow light to be emitted yet provide suitable current spreading over the active layer 18. Wires 50 and 52 are coupled to a power supply for the LED die.

Light emitted by the active layer 18 is either directly emitted through the GaP substrate 26 or is emitted after the light reflects off one or more of the internal surfaces of the die. Any light incident on the porous n-GaP layer 24 is diffusively reflected by the pores. The metal extending through the vias also reflects the light. Substantially no light reaches the reflective metal layer 44 through the n-GaP layer 24. Any light impinging on the metal layer 44 is reflected toward the active layer and further diffused by the n-GaP layer 24. The diffusion of light has been determined to increase the light extraction efficiency of the LED structure by 30%. Hence, if the extraction efficiency of a conventional AlInGaP LED is 14%, the addition of the porous n-GaP layer 24 increases the efficiency to about 18% with no increase in the operating forward voltage.

Figure 11:
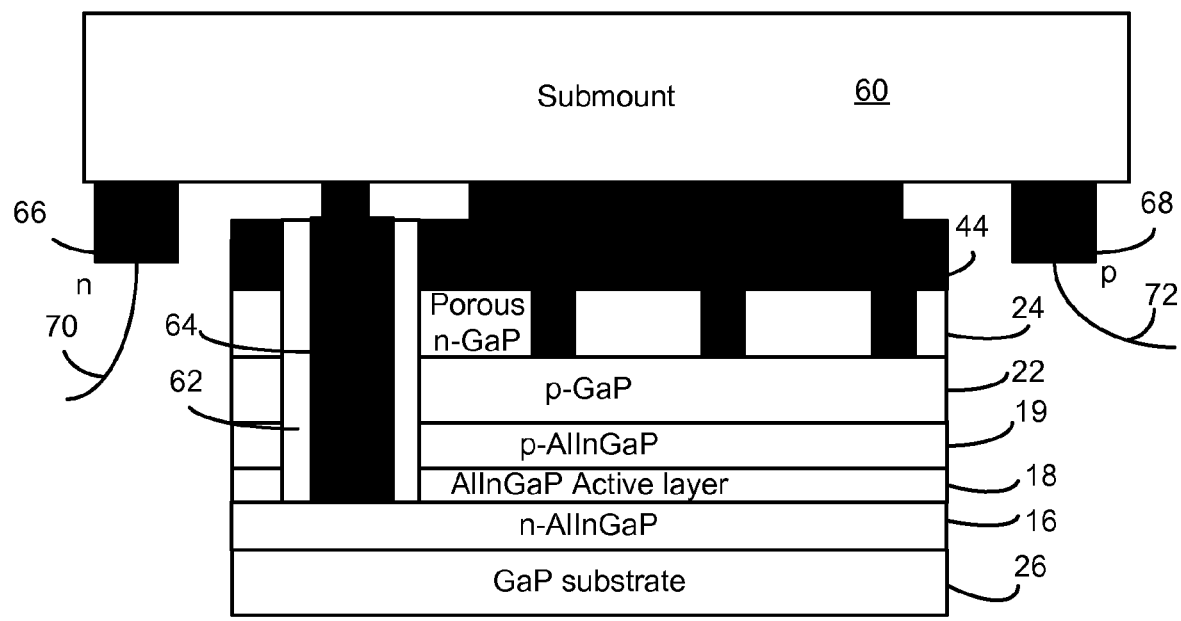
FIG. 11 illustrates a flip chip version of the LED chip mounted on a submount.

In another embodiment, shown in FIG. 11, the LED die is formed as a flip chip, with the n and p contacts formed on the same surface, facing the submount 60. To form a directly contact to the n-AlInGaP layer 16, a via is etched through the porous n-GaP layer 24, the p-GaP layer 22, and the active layer 18. An insulating material 62, such as silicon nitride formed by plasma deposition, is then formed on the inner walls of the via. The via is then filled with a metal 64 by evaporation so that the n and p contacts for attachment to the submount 60 are substantially planer. The contacts are then ultrasonically welded to gold pads on the submount 60. Solder or other bonding materials may be used instead of ultrasonic welding. A metal pattern on the submount 60 contains n and p contacts 66, 68 for bonding wires 70, 72 thereto. Other forms of electrical connection between the submount and the power supply may be used, such as making the submount a surface mount structure where the submount has metal pads on its bottom surface for direct bonding to pads on a circuit board.

Figure 12:
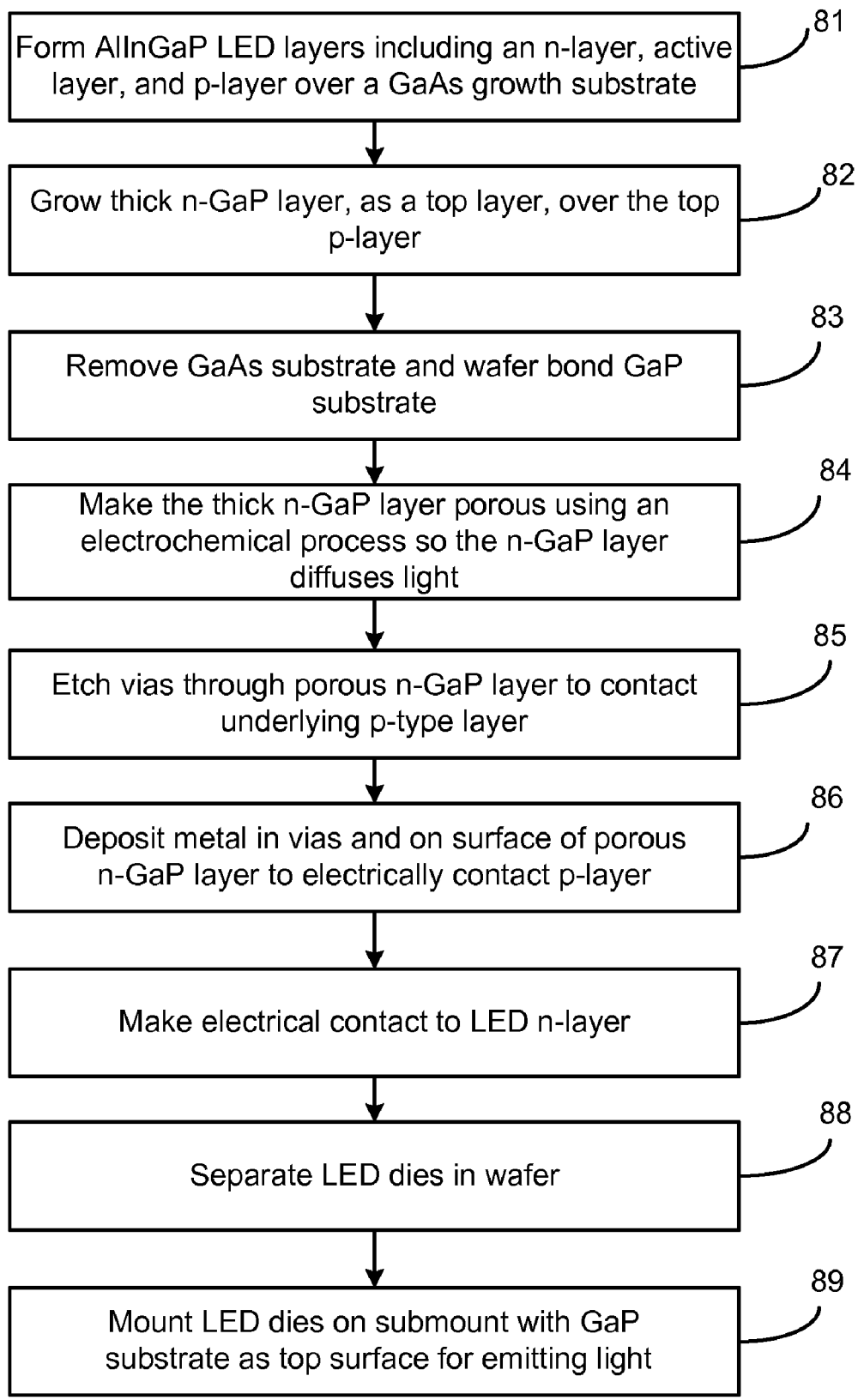
FIG. 12 is a flowchart of the general process used to form an LED structure in accordance with one embodiment of the invention.

FIG. 12 is a self-explanatory flowchart containing steps 81-89 summarizing the above-described process.

Figure 13:
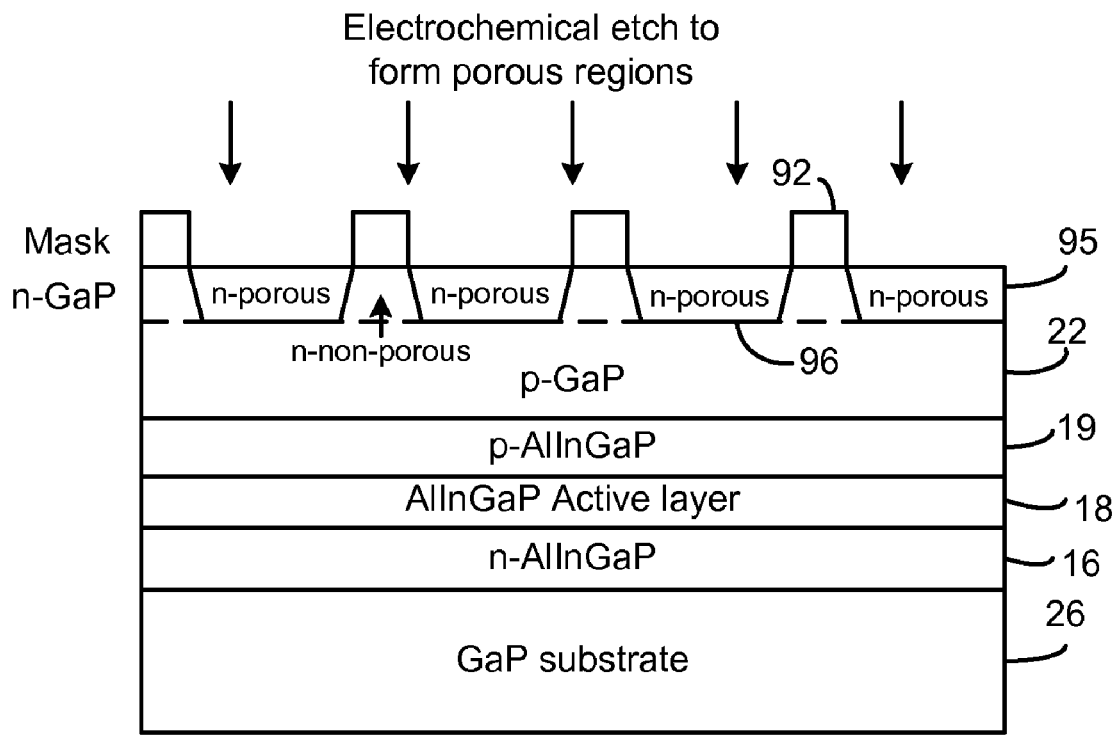
FIGS. 13, 14, and 15 illustrate another embodiment of an LED structure using a porous light diffusing layer and an n-type to p-type conversion process, wherein no metal-filled vias are used to contact a p-GaP layer underlying the porous n-GaP layer.
Figure 14:
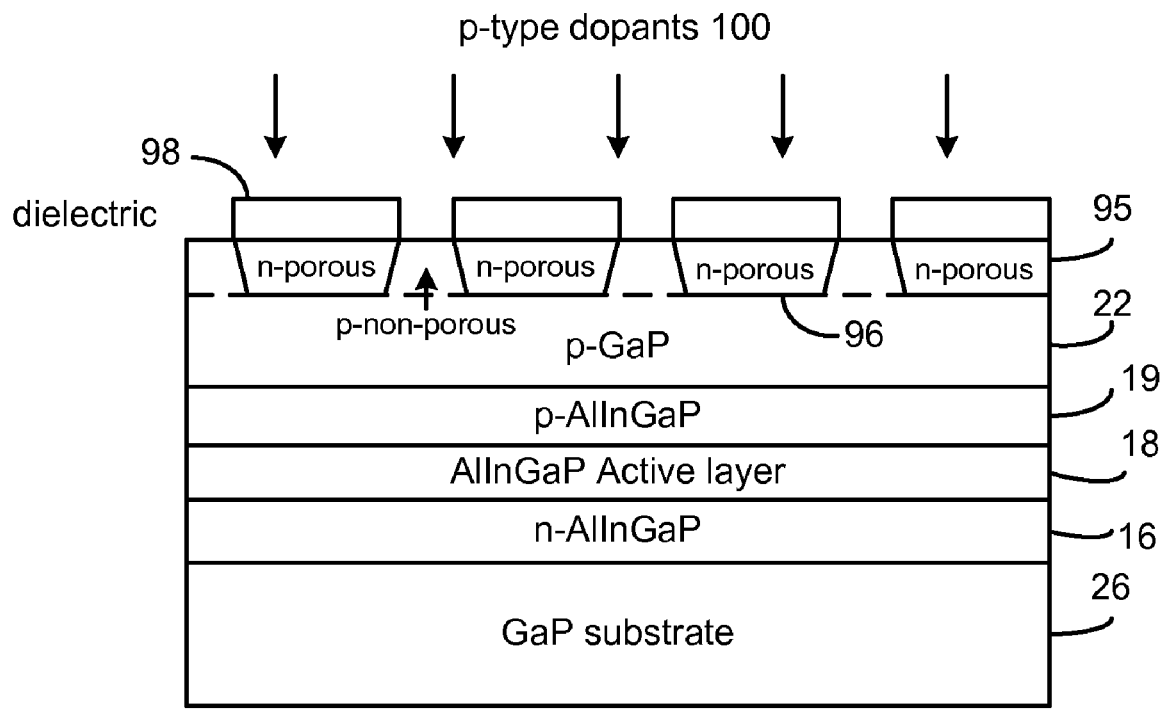
Figure 15:
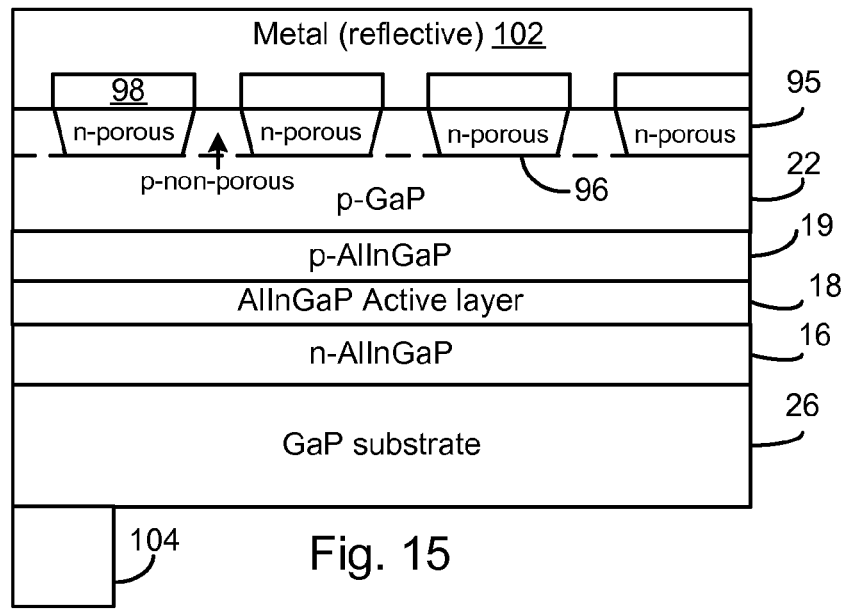

FIGS. 13-15 illustrate another embodiment where metal vias through the porous n-GaP layer are obviated. In FIG. 13, the non-porous top n-GaP layer 95 (layer 24 in FIG. 1) is masked using photoresist portions 92 to expose portions of the top surface of the n-GaP layer 95. The exposed n-GaP regions 96 are then subjected to the electrochemical etch process of FIG. 3 (which only affects n-type material) to make those n-GaP regions 96 porous and light diffusing.

In FIG. 14, a dielectric layer 98 is then deposited and patterned to only cover the porous regions 96, where the dielectric serves as a reflector for light passing through the porous regions. The resist is then removed and the top surface is subjected to a p-type blanket doping 100, where the p-type dopant (e.g., Zn) diffuses into the exposed non-porous n-GaP layer 95 portions to convert those portions to p-type. The dielectric layer 98 is optional but has the benefit of blocking Zn diffusion into the porous portions 96 where it may increase optical absorption. The n-GaP layer 95 may be formed to be relatively thin (less than 20 microns) to achieve the p-type conversion through the entire thickness of the layer 95.

In FIG. 15, a metal layer 102 is then formed over the top surface of the p-type regions and the dielectric layer 98, forming an ohmic contact to the nonporous p-type regions. The nonporous regions will be heavily doped from the diffusions and provide a low resistance current path. Since direct contact is made between the metal and the p-type regions, no current need flow through any porous layer to reach the active region so there is minimal increase in forward voltage drop. A 10% nonporous area 10 um thick would add approximately 20 meV to a typical forward voltage. Accordingly, no vias are required in this embodiment to electrically contact the p-GaP layer 22. The metal is reflective so that substantially all light is reflected or diffusively reflected back toward the active layer.

A metal contact 104 may be formed on the GaP substrate 26 for electrically contacting the n-AlInGaP layer 16, or a flip chip contact to the layer 16 may be formed. As in the previous embodiment, the LED chip is mounted on a submount.

The addition of reflective metals or any reflective dielectric over the porous layer reduces the necessary thickness of the porous layer since the porous layer may allow some amount of light to pass through and be reflected back into the LED. Reducing the thickness of the porous layer is desirable to decrease processing time and make the patterning easier to accomplish. In the embodiment of FIG. 15 where there are non-porous semiconductor current channels between the porous portions, a thinner porous layer is particularly desirable since the electrochemical etch to form the pores is isotropic. The optimal thickness of the porous layer depends on the particular LED formed and may be determined empirically.

Figure 16:
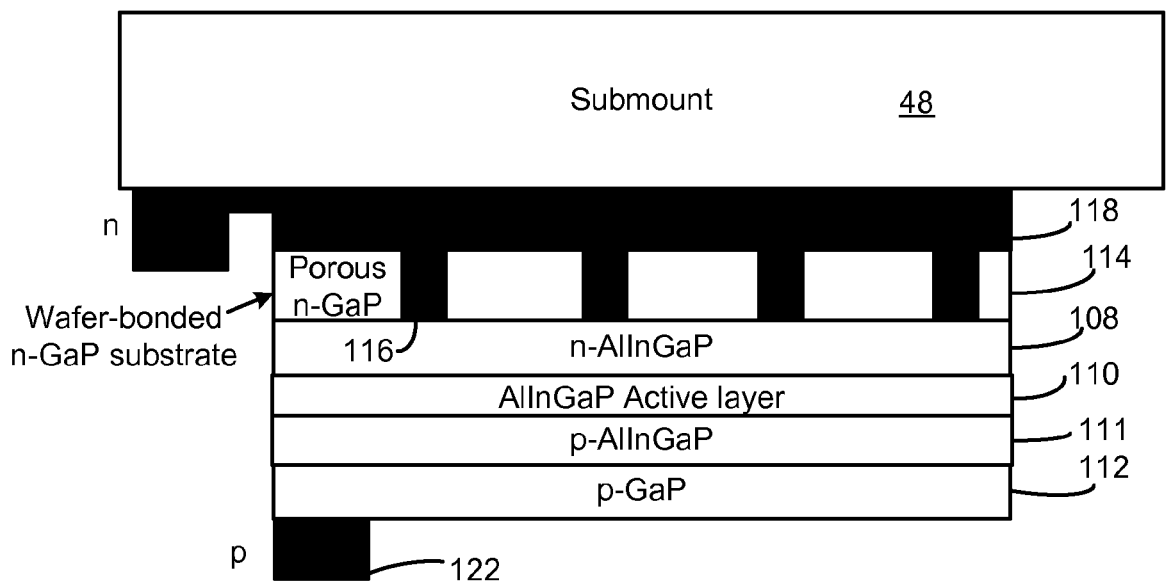
FIG. 16 illustrates another embodiment of the invention where the growth substrate is removed, an n-type GaP substrate is wafer bonded to the n-AlInGaP layer and made porous, and metal-filled vias are formed through the porous layer to contact the n-AlInGaP layer.

FIG. 16 illustrates another embodiment. An n-AlInGaP layer 108 is grown on a GaAs growth substrate (not shown), followed by an active layer 110, a p-AlInGaP layer 111, and a p-type GaP layer 112. The growth substrate is then replaced with an n-type GaP substrate 114, using wafer bonding, directly contacting the n-AlInGaP layer 108. The GaP substrate 114 is then subjected to an electrochemical etch process similar to FIG. 3 (a voltage is applied to the GaP substrate 114) to form pores through a certain thickness of the GaP substrate 114. The GaP substrate 114 may be reduced in thickness by any known means (mechanical, chemical) prior to the electrochemical etch process so that the pores may extend completely through the substrate. Metal-filled vias 116 are then formed through the porous layer to directly contact the n-AlInGaP layer 108 (or directly contact a non-porous material) so that there will be no forward voltage drop across the porous layer. A metal layer 118 over the porous layer contacts the vias to form the cathode electrode. A metal contact 122 is formed over the p-GaP layer 112. The LED is then mounted on a submount 48.

Figure 17:
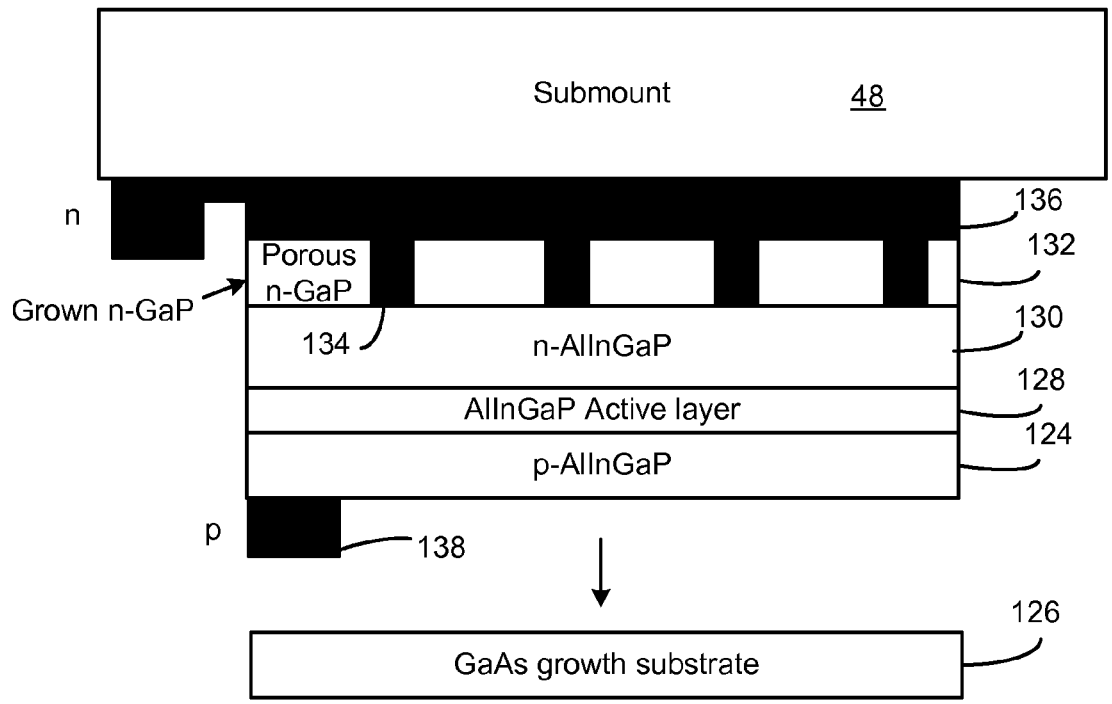
FIG. 17 illustrates another embodiment of the invention where a p-AlInGaP cladding layer followed by an active layer, an n-AlInGaP cladding layer, and an n-GaP layer are grown on a growth substrate, and the top n-GaP layer is then made porous. Metal-filled vias are formed through the porous layer to contact the underlying n-AlInGaP layer, and the growth substrate is removed to allow light to exit through the p-layer surface.

FIG. 17 illustrates another embodiment. One or more p-AlInGaP cladding layers 124 are grown over the GaAs substrate 126 followed by growing an active layer 128, an n-AlInGaP cladding layer 130, and a top n-GaP layer 132. The n-GaP layer 132 is then made porous using the electrochemical etch process of FIG. 3. Metal-filled vias 134 are then formed through the porous layer so that no current flows through the high-resistance porous layer, and a metal layer 136 is formed over the porous layer to contact the vias and act as a reflector. The GaAs substrate 126 is removed to allow light to exit through the top of the p-AlInGaP layer 124. A metal electrical contact 138 is made to the p-layer. The LED is then mounted on a submount 48.

Figure 18:
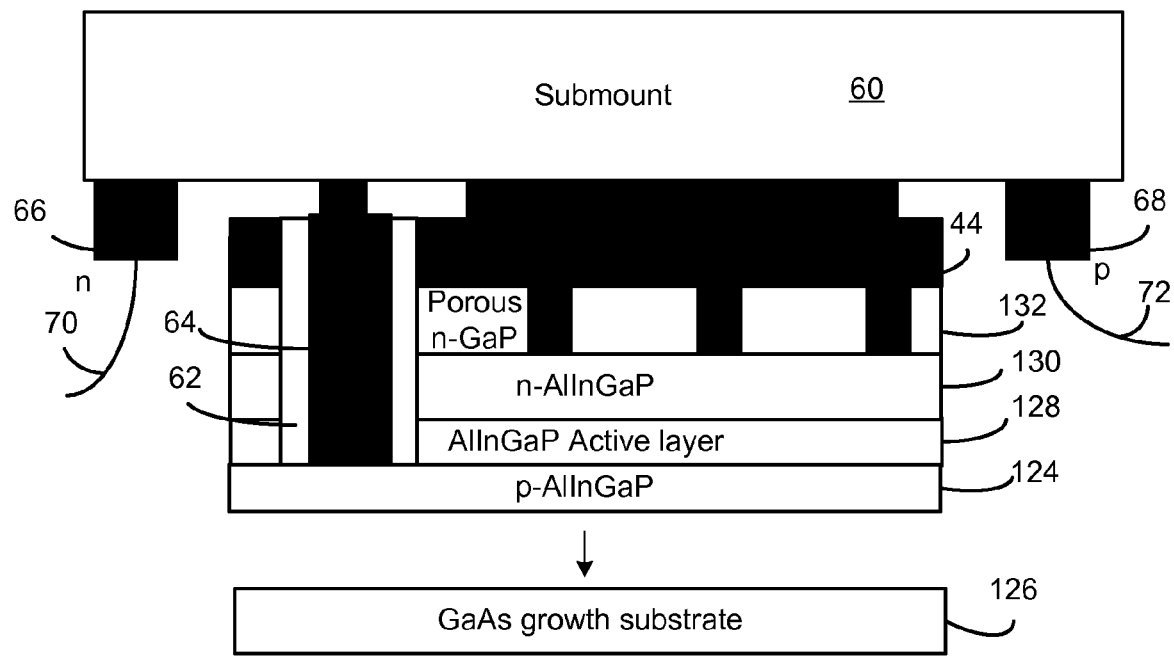
FIG. 18 is similar to FIG. 17 except that the LED is a flip chip.

FIG. 18 is similar to FIG. 17 except that the LED is a flip chip. The flip chip electrical contact structure and submount were described with respect to FIG. 11.

Figure 19:
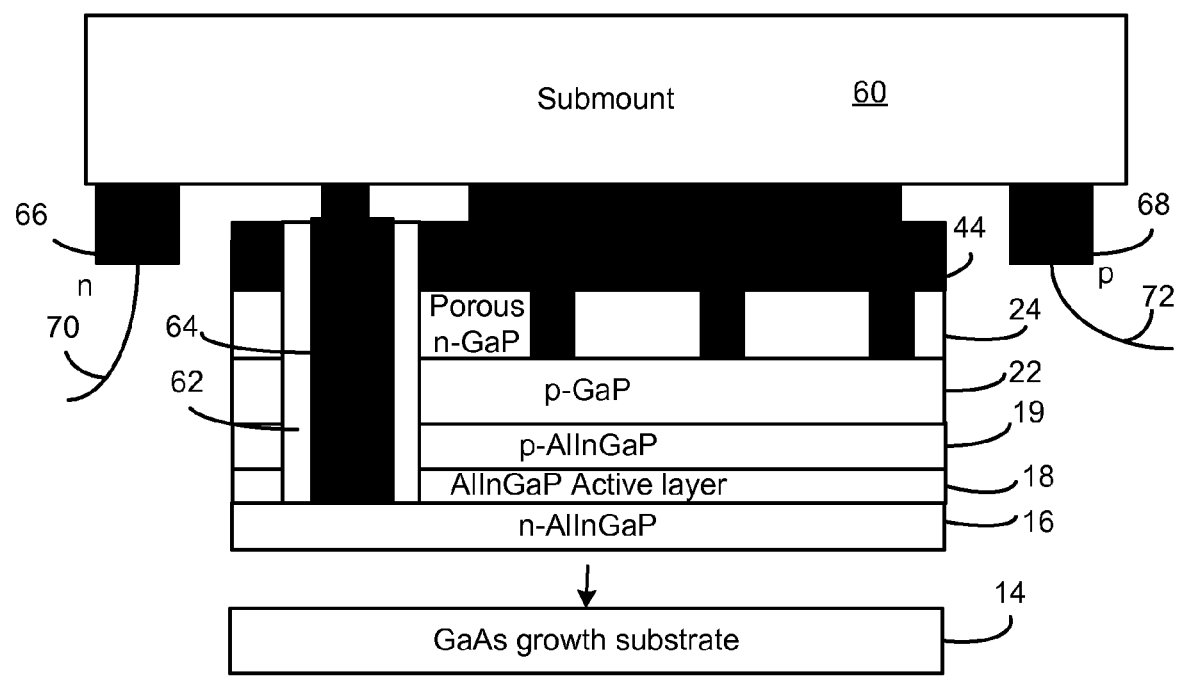
FIG. 19 is similar to FIG. 11 except that the GaAs growth substrate is only removed (e.g., etched away) after the LED die is mounted on the submount, resulting in a very thin LED structure.

FIG. 19 is similar to FIG. 11 except that the GaAs growth substrate 14 is removed by etching after the LED die is mounted on the submount 60, resulting in a very thin LED structure.

An array of LED dies may be mounted on a single submount wafer to simplify processing and handling. Various processes may be performed while the LED dies are mounted on the submount wafer, such as depositing a phosphor coating over each die, roughening the top surface of each die to increase light extraction, removing the growth substrate, encapsulating each LED die, molding lenses over each LED die, or other process. After such processing, the submount wafer is sawed to singulate the LED structures. The submounts may later be mounted on printed circuit boards.

In all embodiments, there may be additional semiconductor layers used in an actual LED to reduce material defects, reduce stress, spread current, or provide other well known benefits. Such additional layers also form part of the LED of the present invention. For example, a first layer said to be overlying or underlying a second layer may actually have intermediate layers between the first and second layers.

Furthermore, an anti-reflection coating may be combined with the porous layer to great advantage. For a typical rectangular chip with a micro-roughened surface, an anti-reflection coating provides no significant improvement in extraction efficiency. However, a buried porous layer randomizes the photons, reduces internal loss, and preserves a planar surface. Therefore, the reduction of the Fresnel reflection improves the extraction efficiency in almost direct proportion to the improvement in single pass transmission. Given a 15% initial external quantum efficiency (EQE), an increase in transmission from 70% to 100% would increase the resulting EQE according to 30%×15%=4.5%, resulting in a final EQE of 19.5%.

Referring to an LED structure as being "gallium phosphide (GaP) based" is used herein to denote an LED comprising one or more layers containing GaP with any amounts, including zero, of aluminum and indium. Although a GaP based LED has been described, the techniques described herein may be applied to materials in an LED that are not GaP based.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light emitting diode (LED) structure comprising:
   a plurality of LED layers including a first cladding layer, an active layer, and a second cladding layer grown on a growth substrate, the first cladding layer being of a first conductivity type, and the second cladding layer being of an opposite second conductivity type;
   a porous semiconductor layer overlying the second cladding layer, the porous semiconductor layer containing pores having a sub-micron minimum diameter, the pores having characteristics that diffuse light generated by the active layer;
   a first metal, overlying the porous semiconductor layer, that electrically contacts the second cladding layer such that a majority of current flows between the first metal and the second cladding layer without being substantially conducted through porous areas of the porous semiconductor layer;
   a second metal electrically contacting the first cladding layer; and
   metal-filled vias through the porous semiconductor layer to allow the first metal to electrically contact the second cladding layer.

2. The structure of claim 1 wherein the porous semiconductor layer is a porous GaP based layer.

3. The structure of claim 1 wherein the porous semiconductor layer has openings through which the first metal electrically contacts the second cladding layer without conducting current through the porous semiconductor layer.

4. The structure of claim 1 wherein substantially no current flows through the porous semiconductor layer.

5. The structure of claim 1 wherein the porous semiconductor layer is grown overlying the second cladding layer with at least one intermediate layer of the same conductivity type as the second cladding layer in-between.

6. The structure of claim 1 wherein the layer underlying the porous semiconductor layer is the second cladding layer.

7. The structure of claim 1 wherein the layer underlying the porous semiconductor layer is a layer other than the second cladding layer.

8. The structure of claim 1 wherein the pores extend completely through the porous semiconductor layer.

9. A light emitting diode (LED) structure comprising:
a plurality of LED layers including a first cladding layer, an active layer, and a second cladding layer grown on a growth substrate, the first cladding layer being of a first conductivity type, and the second cladding layer being of an opposite second conductivity type;
a porous semiconductor layer overlying the second cladding layer, the porous semiconductor layer containing pores having a sub-micron minimum diameter, the pores having characteristics that diffuse light generated by the active layer;
a first metal, overlying the porous semiconductor layer, that electrically contacts the second cladding layer such that a majority of current flows between the first metal and the second cladding layer without being substantially conducted through porous areas of the porous semiconductor layer;
wherein the porous semiconductor layer comprises regions of porous GaP based material, having a first level of doping, and a plurality of separate regions of non-porous GaP based material, having a second level of doping higher than the first level of doping, distributed throughout the porous semiconductor layer, wherein surfaces of the regions of porous GaP based material and non-porous GaP based material are substantially coplaner, and wherein the first metal directly electrically contacts the non-porous GaP based material and overlies the surfaces of the regions of porous GaP based material and the non-porous GaP based material.

10. The structure of claim 1 wherein the porous semiconductor layer is a wafer bonded substrate.

11. The structure of claim 1 wherein the porous semiconductor layer is a layer that has been grown overlying the second cladding layer.

12. The structure of claim 1 wherein the porous semiconductor layer is n-type and the second cladding layer is p-type.

13. The structure of claim 1 wherein the porous semiconductor layer is n-type and the second cladding layer is n-type.

14. The structure of claim 1 wherein the second cladding layer is grown over the growth substrate after the first cladding layer is grown over the growth substrate.

15. The structure of claim 1 wherein the porous semiconductor layer is an n-type GaP layer.

16. The structure of claim 1 wherein the growth substrate has been removed.

17. The structure of claim 1 further comprising a GaP substrate that replaced the growth substrate.

18. The structure of claim 1 wherein the plurality of LED layers comprises a first AlInGaP layer grown over the growth substrate, an AlInGaP active layer grown over the first AlInGaP layer, and a GaP layer grown over the active layer.

19. The structure of claim 1 wherein the porous semiconductor layer is at least 5 microns thick.

20. The structure of claim 1 wherein the porous semiconductor layer is at least 10 microns thick.

21. The structure of claim 1 wherein the porous semiconductor layer is formed by immersing a non-porous semiconductor layer in an acid bath and running a current through the semiconductor layer.

22. The structure of claim 1 wherein the porous semiconductor layer contains pores extending approximately perpendicular to a surface of the porous semiconductor layer, the pores having a diameter less than a micron, the pores extending completely through the porous semiconductor layer, wherein the pores make up over 10% of a volume of the porous semiconductor layer.

23. The structure of claim 1 wherein the pores extend approximately perpendicular to a surface of the porous semiconductor layer.

24. The structure of claim 1 wherein the LED structure is formed as a flip chip where the first metal and the second metal terminate on a same surface.

25. The structure of claim 1 wherein the first metal and the second metal terminate on different surfaces of the LED structure.

26. The structure of claim 1 further comprising a submount on which a die comprising the plurality of LED layers and the porous semiconductor layer is mounted.

* * * * *